United States Patent [19]

Kozono

[11] Patent Number: 5,581,123
[45] Date of Patent: Dec. 3, 1996

[54] SEMICONDUCTOR DEVICE AND ITS MANUFACTURING METHOD

[75] Inventor: Hiroyuki Kozono, Omiya, Japan

[73] Assignee: Kabushiki Kaisha Toshiba, Kawasaki, Japan

[21] Appl. No.: 442,885

[22] Filed: May 17, 1995

[30] Foreign Application Priority Data

May 19, 1994 [JP] Japan .................... 6-129639

[51] Int. Cl.$^6$ .................................................. H01L 23/04
[52] U.S. Cl. ........................................ 257/698; 257/692
[58] Field of Search ............................. 257/698, 697, 257/774, 780, 781, 784, 786

[56] References Cited

U.S. PATENT DOCUMENTS

| | | | |
|---|---|---|---|
| 4,742,385 | 5/1988 | Kohnoto | 257/697 |
| 5,006,922 | 4/1991 | McShame et al. | 257/697 |
| 5,200,366 | 4/1993 | Yamada et al. | 257/697 |

Primary Examiner—Sara W. Crane
Assistant Examiner—S. V. Clark
Attorney, Agent, or Firm—Finnegan, Henderson, Farabow, Garrett & Dunner, L.L.P.

[57] ABSTRACT

A semiconductor device comprises a semiconductor substrate having an integrated circuit having a connection electrode on its surface. A substrate mount section, having at least one concave portion on its main surface, is formed to support the semiconductor substrate to be fixed thereto. A first conductive metallic layer is formed on the main surface of the substrate mount section including a surface of the concave portion. A plurality of leads are supported and fixed to a peripheral portion of the main surface of the substrate mount section such that their end portions are opposite to the semiconductor substrate. The end portion of each lead and the connection electrode of the main surface of the semiconductor substrate are connected by a bonding wire. A cap is formed to have at least a first concave portion formed at a position opposite to the concave portion of the substrate mount section on the main surface, and a second concave portion formed at a central portion of the main surface to at least coat the semiconductor substrate, the bonding wire and the end portion of the lead. A second conductive metallic layer is formed on the entire surface of the cap including each surface of the first and second concave portions. One end portion of a column projection section is fixed to the first concave portion of the cap.

5 Claims, 6 Drawing Sheets

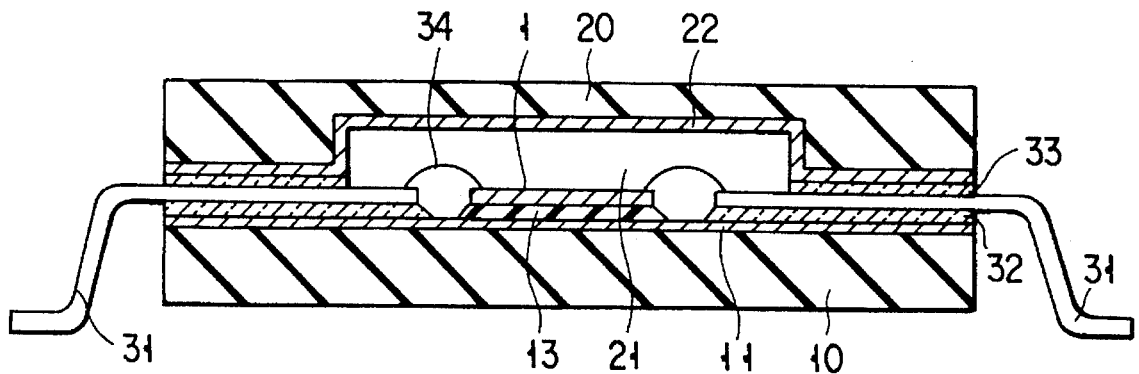
F I G. 3
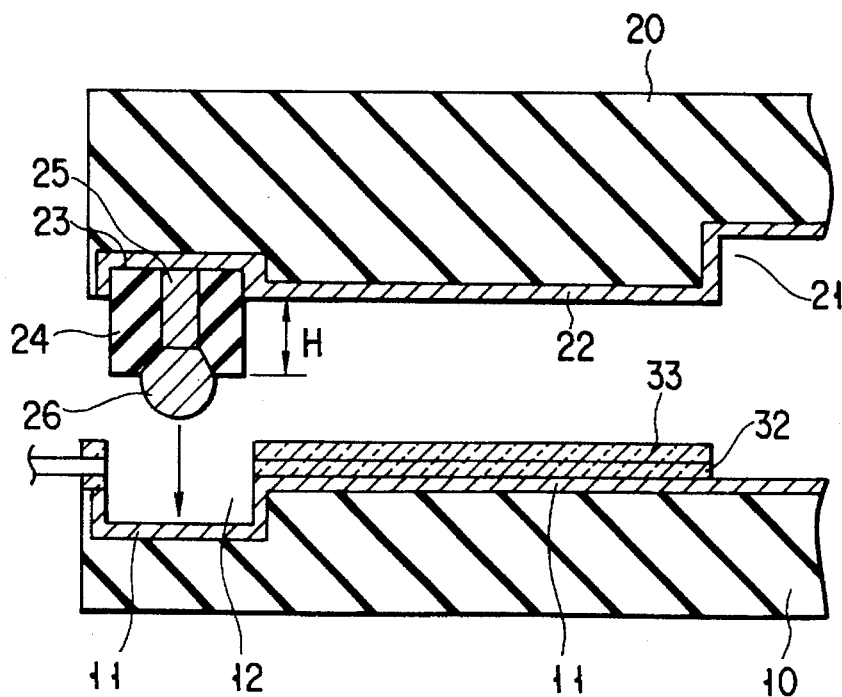
F I G. 4

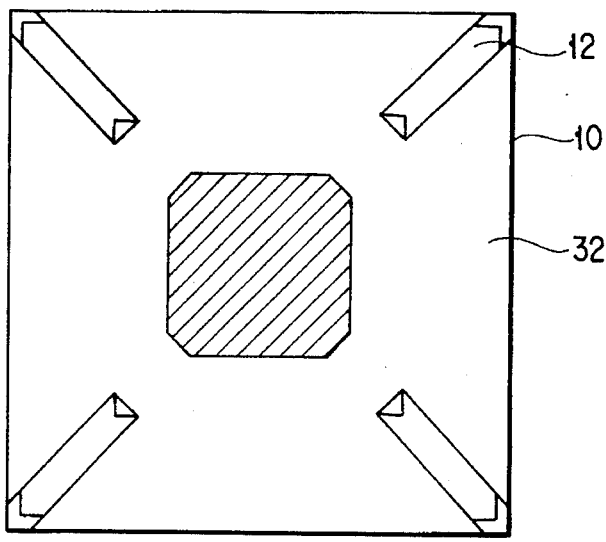
F I G. 8
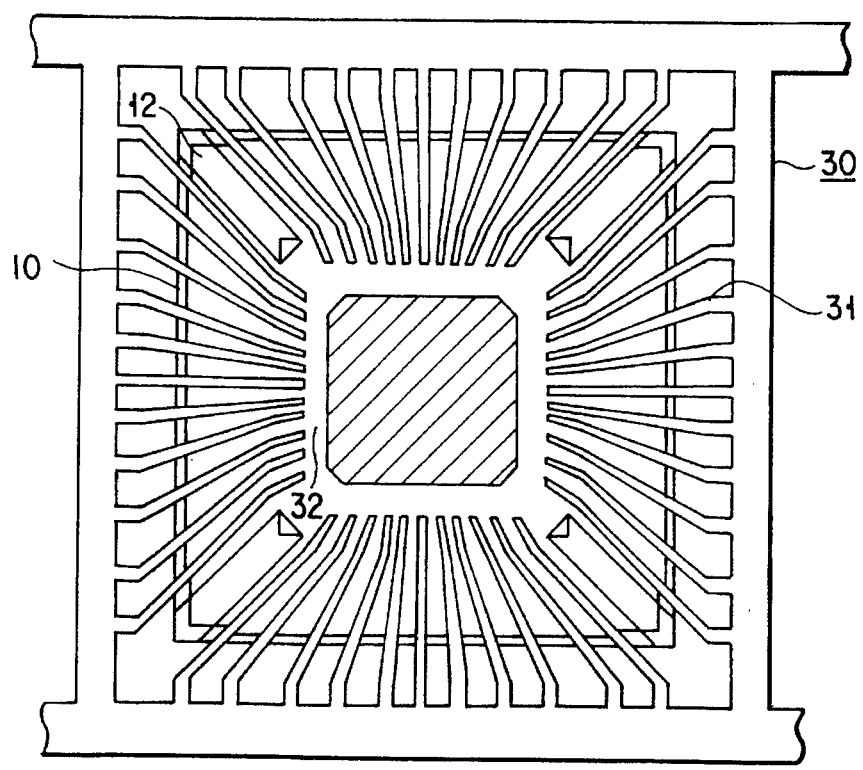
F I G. 9

SEMICONDUCTOR DEVICE AND ITS MANUFACTURING METHOD

BACKGROUND OF THE INVENTION

1. Field of the Invention

The present invention relates to a semiconductor device, which can be simply manufactured and has a high frequency characteristic to be used in the range of, for example, 500 MHz to 1 GHz.

2. Description of the Related Art

A semiconductor device in which an integrated circuit such as IC, LSI is formed is contained in a packaged such as ceramics. FIG. 1 shows one example of a conventional semiconductor device. A semiconductor substrate 1 such as a silicon semiconductor having an integrated circuit is formed is adhered to a central part of a substrate mount section 2 formed of a ceramic substrate such as aluminum nitride.

For example, a lead 3, which is formed of a lead frame formed of an Fe alloy containing Ni 42 wt %, is adhered to a peripheral section of the substrate mount section 2 with insulating seal material 4 such as glass. Leads 3, 3 are formed at both ends of the semiconductor substrate 1 to have a distance, respectively.

By use of a bonding wire 5 such as an Au wire or an Al wire, an end (inner lead) of lead 3 is connected to a connection electrode formed on the semiconductor substrate to be electrically connected to the integrated circuit formed in the semiconductor substrate 1.

The substrate mount section 2 is adhered to a cap 6, which is formed of the same material as the seal material 4 used in the adhesion of the leads 3, 3. The cap 6 has a concave portion, and a main surface facing the substrate mount section 2 is formed to be concave. In the concave portion, there are provided the semiconductor substrate 1, the inner lead of the leads 3, 3 and the bonding wire 5 are formed to be sealed.

The cap material is formed of ceramic such as aluminum nitride, which is the same as the case of the substrate mount section.

The semiconductor substrate 1, which is mounted on the central part of the substrate mount section 2, is adhered to the substrate mount section 2 with a conductive adhesive 7 such as epoxy resin.

In recent years, the use of the semiconductor device under a high frequency condition has been increased. However, since a lead, which is formed of a lead frame, is used as a power source line in the above-mentioned conventional semiconductor device, inductance becomes large and noise is increased.

Since only the leads are used as a transmission line of the integrated circuit formed in the semi-conductor substrate, at least one of four leads must be grounded (GND) to prevent resonance when the leads are used in a frequency band of 300 MHz or more. Therefore, in this case, the number of leads must be 1.25 times the originally necessary number of leads.

Moreover, in a case of 500 MHz or more, transfer impedance must be matched in consideration of the transmission characteristic. Therefore, one of two leads must be grounded, and it is needed that the number of leads be doubled as compared with the necessary number of leads.

Furthermore, several signal lines are provided between the leads serving as GND, and distances between GND and signal lines differ, and are asymmetrical. Due to this, if the frequency exceeds 300 MHz, resonance is generated and impedance matching can not be obtained.

SUMMARY OF THE INVENTION

In consideration of the above-mentioned problem, an object of the present invention is to provide a semiconductor device and its manufacturing method wherein transfer impedance matching, which is required in a semiconductor device operatable in a high frequency region, can be obtained, and the structure, which obtains a potential from a rear surface of a semiconductor substrate having an integrated circuit formed, can be realized in a form where a shield effect is contained without largely changing the conventional manufacturing process.

In order to attain the above object, according to the present invention, there is provided a semiconductor device comprising: a semiconductor substrate having an integrated circuit having a connection electrode on its surface; a substrate mount section, having at least one concave portion on its main surface, for supporting the semiconductor substrate to be fixed thereto; a first conductive metallic layer formed on the main surface of the substrate mount section including a surface of the concave portion; a plurality of leads supported and fixed to a peripheral portion of the main surface of the substrate mount section such that their end portions are opposite to the semiconductor substrate; a bonding wire for connecting the end portion of each lead and the connection electrode of the main surface of the semiconductor substrate; a cap having at least a first concave portion formed at a position opposite to the concave portion of the substrate mount section on the main surface, and a second concave portion formed at a central portion of the main surface to at least coat the semiconductor substrate, the bonding wire and the end portion of the lead, a second conductive metallic layer formed on the entire surface of the cap including each surface of the first and second concave portions; and a column projection section having one end portion fixed to the first concave portion of the cap, so as to be served as a conductive line electrically connected to the second conductive metallic layer therein at its one end, the column projection section inserted to the concave portion of the opposite substrate mount section, and the conductive line electrically connected to the first conductive metallic layer at the other end.

Moreover, according to the present invention, there is provided a method for manufacturing a semiconductor device comprising the steps of: forming a first conductive metallic layer on a main surface of a substrate mount section and along at least one concave portion formed on the main surface; supporting a semiconductor substrate having an integrated circuit to be fixed to the substrate mount section; mounting a plurality of leads on a peripheral portion of the main surface of the substrate mount section to be fixed thereto with an insulating adhesive such that an end portion of each of the leads is opposite to the semiconductor substrate; connecting the end portion of each of the leads and a connection electrode of the main surface of the semiconductor substrate by a bonding wire; forming a second conductive metallic layer on each surface of the main surface of a cap, at least one first concave portion formed at a position opposite to the concave portion of the substrate mount section on the main surface, and a second concave portion to at least coat the semiconductor substrate, the bonding wire and the end portion of the lead; fixing one end portion of a column projection section, serving as a conductive line, to the second concave portion of the cap so as to electrically connect the conductive line to the second conductive metallic layer at its one end; inserting the column projection section to the concave portion of the opposite substrate mount section so as to electrically connect the conductive line to the first conductive metallic layer at the other end; applying an insulating adhesive on each of the lead; and adhering the cap to the substrate mount section with the insulating adhesive by thermally pressure.

By the above-mentioned structure, according to the semiconductor device and the method for manufacturing the semiconductor device, the concave portion of the substrate mount section is inserted to the column projection section of the cap, so that the first conductive metallic layer formed on the substrate mount section and the second conductive metallic layer formed on the cap surface can be electrically connected to each other. Moreover, the rear surface of the semiconductor substrate and the second conductive metallic layer are grounded, and the predetermined leads are electrically connected to the first and second conductive metallic layers, whereby the transfer impedance matching can be obtained in upper and lower directions of the semiconductor device.

As a result, only the number of leads, which is originally needed, may be used. There can be provided the semiconductor device, which can be used under the high frequency band of, for example, 500 MHz to 1 GHz. Moreover, in the case where the conductive line is formed in the column projection section of the cap, the first and second conductive metallic layers, which are formed on the substrate mount section and the cap, can be electrically connected to each other without being short-circuited.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross sectional view taken along a line III—III as shown in FIG. 2;

FIG. 4 is a cross section view showing a part of a cross sectional view taken along a line IV—IV shown in FIG. 2, and a state before a column projection section of a cap is inserted to a concave portion of a substrate mount section;

FIG. 8 is further another manufacturing process view in the following manufacturing process of FIG. 7;

FIG. 9 is further another manufacturing process view in the following manufacturing process of FIG. 8;

DETAILED DESCRIPTION OF THE PREFERRED EMBODIMENTS

Embodiments of the present invention will be explained with reference to the drawings.

Figure 1:
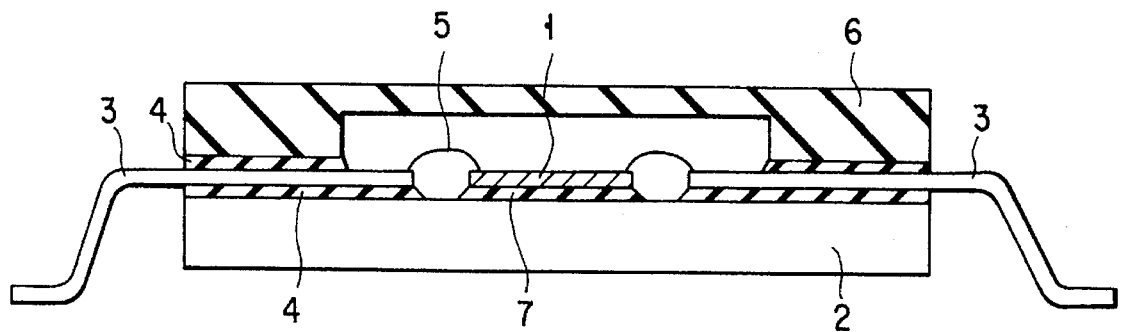
FIG. 1 is a cross sectional view showing a schematic structure of a conventional semiconductor device.
Figure 2:
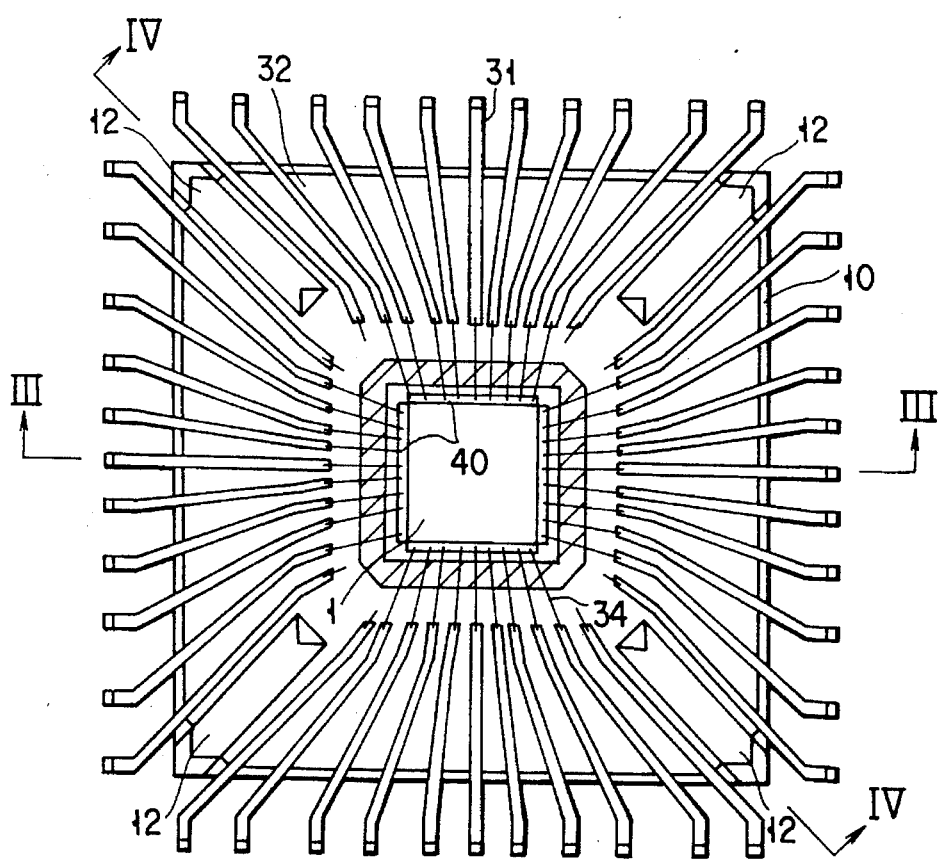
FIG. 2 is a plan view showing a first embodiment of a semiconductor device of the present invention.

FIG. 2 is a plan view of a packaged semiconductor device, and a cap (ceramic cap) and a display of seal material on an upper side are omitted since it is sufficient if the interior of the device is explained.

FIG. 3 is a cross sectional view taken along a line III—III of FIG. 2. As shown in FIGS. 2 and 3, a substrate mount section 10 are formed of a ceramic substrate such as aluminum nitride or alumina.

In this embodiment, the substrate mount section 10 is square. However, the shape is not limited in the present invention. The shape may be a polygon such as a pentagon, a hexagon, or a circular shape may be used. Then, at least one concave portion 12 is formed in a main surface where a semiconductor substrate of the substrate mount section 10 is mounted. In this figure, the concave portion 12 is formed at each corner, and the long and thin concave portion 12 is formed to be extended toward the center of the semiconductor substrate 1.

A first conductive metallic layer 11 is deposited on a main surface of the substrate mount section 10 by a vacuum evaporation or spattering. As first conductive metallic layer 11, there is used a W/Ni/Au film. The first conductive metallic layer 11 is also formed on, as shown in FIG. 4, an internal surface of the concave portion 12 of the main surface of the substrate mount section 10. The semiconductor substrate 1 where an integrated circuit is formed is adhered onto the first conductive metallic layer 11 of the central portion of the main surface by soldering or with a conductive adhesive 13 such as epoxy resin.

On the other hand, around a peripheral section of the main surface where the semiconductor substrate of the substrate mount section 10 is mounted, a plurality of leads 31 are provided every side to be fixed by a first seal material 32 such as glass. An end of each of the leads 31 is directed to the center of the semiconductor substrate 1. The end of each of the leads 31 and a connection electrode (not shown in FIG. 3) on the surface of the semiconductor substrate 1 are connected to each other by a bonding wire 34 such as an Au wire or an Al wire.

The leads 31, which are provided on both sides of the concave portions 12, are connected to the first conductive metallic layer 11 by the bonding wire 34. The first conductive metallic layer 11 is grounded and used as a grounded power source line.

A second seal material 33 such as glass is provided on the arranged lead group, and a cap 20 is further provided thereon so as to be thermally pressure sealed.

At the same time with the above sealing, a column projection section 24, which is attached to the cap 20, is inserted to the concave portion 12, so that first and second conductive metallic layers 11 and 22 are electrically connected to each other. On the main surface of the cap 20, there are formed a first concave portion 23 at a position opposite to the concave portion 12, and a second concave portion 21 at a central portion.

The second conductive metallic layer 22 is deposited on the main surface of the cap 20 by a vacuum evaporation or spattering when the cap 20 is adhered to the substrate mount section 10, the semiconductor substrate 1, the top end portion of the lead 31, and the bonding wire 34 are contained in the concave portion 21.

As a material of first and second conductive metallic layers 11 and 22 used in the present invention, there can be used a Mo film and a Pd film other than the above-mentioned layer film.

Figure 5:
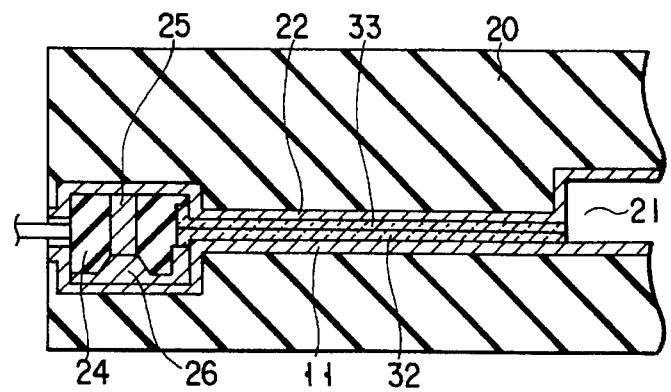
FIG. 5 is a partially cross sectional view showing a process that the concave portion of the substrate mount section and the cap are adhered in the following process of FIG. 4.

The following will explain a method for inserting the column projection section to the concave portion of the substrate mount section with reference to FIGS. 4 and 5.

As one method for forming the column projection section in the first concave portion of the cap 20, there can be used a layering method, which is a well known technique for forming a ceramic package of the semiconductor device. For example, a paste metallic layer is layered on a ceramic green sheet on which a concave portion is formed. Then, a green sheet pattern forming a column projection section is further applied thereon, and sintered at a high temperature of about 1500° C. to form a cap. In this case, a through hole is formed in the green sheet of the column projection section, and metallic paste is buried therein.

FIG. 4 is a partial cross sectional view showing the cap and the peripheral portion of the substrate mount portion. Since FIG. 4 shows a peripheral portion including the concave portion shown a cross sectional view taken along a line IV—IV shown in FIG. 2, no lead is shown.

The second conductive metallic layer 22 is formed on the surfaces of the first and second concave portions 23, 21 of the cap 20, and the inner surface of the cap other than the surfaces of the concave portions 23 and 21.

The ceramic column projection section 24, which is formed of the same material as the cap or the substrate mount section, is buried in the concave portion 23. Moreover, the column projection section 24 is projected by only a height H. A through hole is formed in the column projection section 24, and a conductive path 25, which is formed of the same material as the conductive metallic layer, is formed to be passed through the center of the through hole.

One end of the conductive path 25 contacts the second conductive metallic layer 22, and the other end of the conductive path 25 is exposed to the surface of the column projection section 24. The central portion of the surface of the column projection section 24 is a little dented. Then, a spherical conductive adhering material 26 such as solder is provided on the dent. The spherical conductive adhering material 26 is stably provided by the dent.

If the column projection section 24 having the conductive adhering material 26 is inserted to the concave portion 12 of the substrate mount section 10 to be thermally pressure sealed, solder is melted and the conductive path 25 and the first conductive metallic layer 11 are electrically connected to each other.

The height H of the projected portion of the column projection section 24 is set to a value, which is obtained by subtracting a thickness of the concave portion of the substrate mount section of the conductive adhering material 26 from a value in which a thickness of lead 31, thicknesses of seal materials 32 and 33, and a depth of the substrate mount section concave portion 12 are added to each other.

The seal materials 32 and 33 are needed not to be formed on the concave portion 12 of the substrate mount section.

The following will explain the manufacturing process of the semiconductor device of this embodiment with reference to FIGS. 6 to 10.

Figure 6:
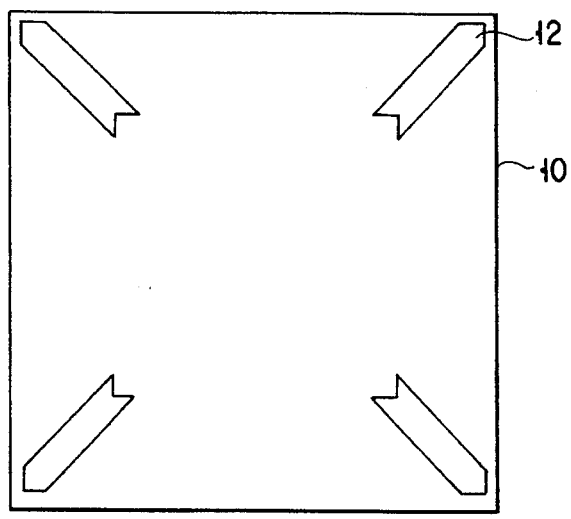
FIG. 6 is a manufacturing process view showing one embodiment of a method for manufacturing the semiconductor device of the present invention.
Figure 7:
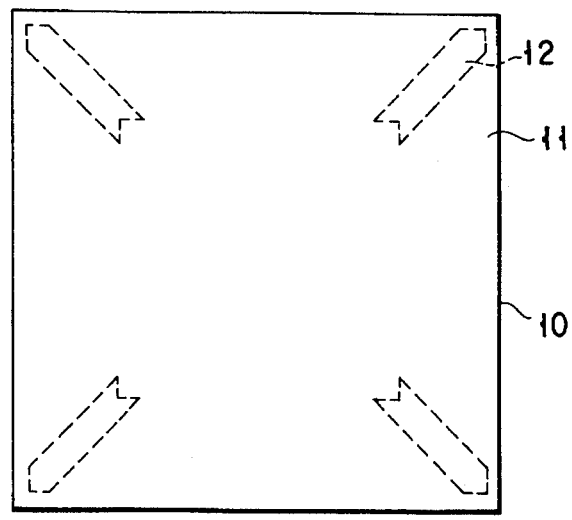
FIG. 7 is another manufacturing process view in the following manufacturing process of FIG. 6.

As shown in FIG. 6, there is formed the ceramic substrate mount section 10 having the long and thin concave portion 12 directing to the central portion from each corner. Then, as shown in FIG. 7, the first conductive metallic layer 11 is deposited on the entire main surface of the substrate mount section 10. The conductive metallic layer 11 is also deposited on the inner portion of the concave portion 12.

Then, as shown in FIG. 8, the first seal material 32 is applied onto the main surface of the substrate mount section 10 excepting the concave portion 12 and the central portion.

Next, as shown in FIG. 9, a lead frame 30, which is formed of Fe alloy containing, for example, Ni 42 wt %, is mounted on the main surface of the substrate mount section 10.

The leads 31 of the lead frame 30 are mounted on the first seal material 32 to be directed to the central portion of the base mount section 10 from each side. The end of each of the leads 31 is directed to the center of the substrate mount section 10.

Figure 10:
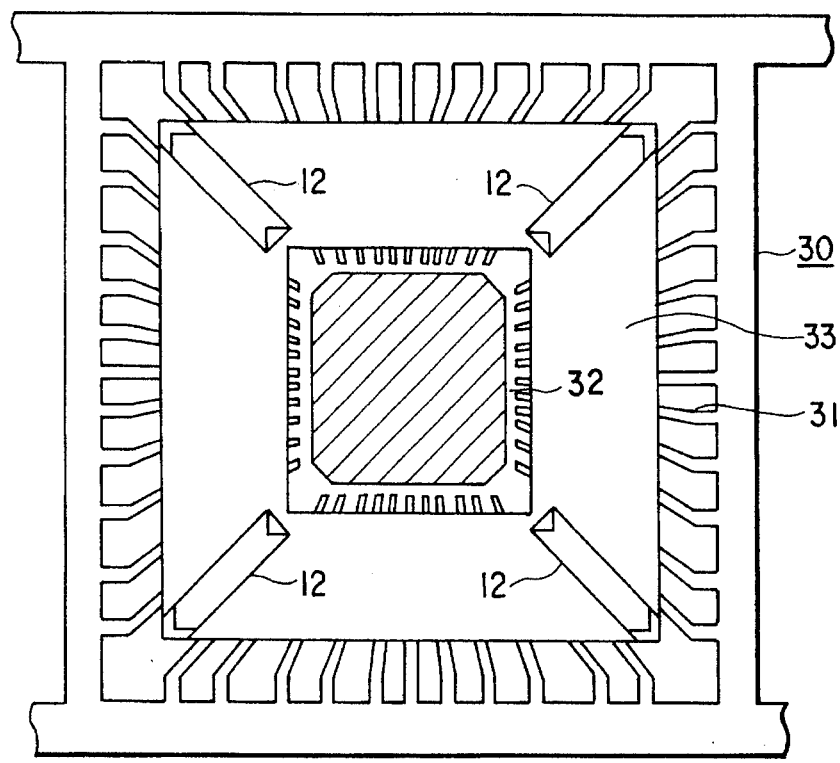
FIG. 10 is further another manufacturing process view in the following manufacturing process of FIG. 9.

Then, as shown in FIG. 10, the second seal material 33 is applied onto the lead 31, the top portion of each of the leads 31 is a little exposed and mounted on the substrate mount section 10 to have substantially the same shape as the first seal material 32. Then, the semiconductor substrate 1 having the integrated circuit formed with the conductive adhering material such as solder is adhered to the central portion of the main surface of the substrate mount section 10.

The end of each of the leads 31 and the connection electrode on the semiconductor substrate 1 are connected to each other by the bonding wire 34. Then, the leads 31, which are provided on both sides of each concave portion 12, are electrically connected to the grounded first conductive metallic layer 11 by the bonding wire 35 to be used as a power source line.

The cap 20 is mounted on the substrate mount section 10, and thermally pressure sealed as explained in FIGS. 4 and 5. Thereafter, the frame portion of the lead frame 30 is separated therefrom, and the end portion of each of the leads 31 exposed outside is shaped to be easily mounted on the wiring substrate, whereby the semiconductor device shown in FIG. 2 is completed.

Figure 11:
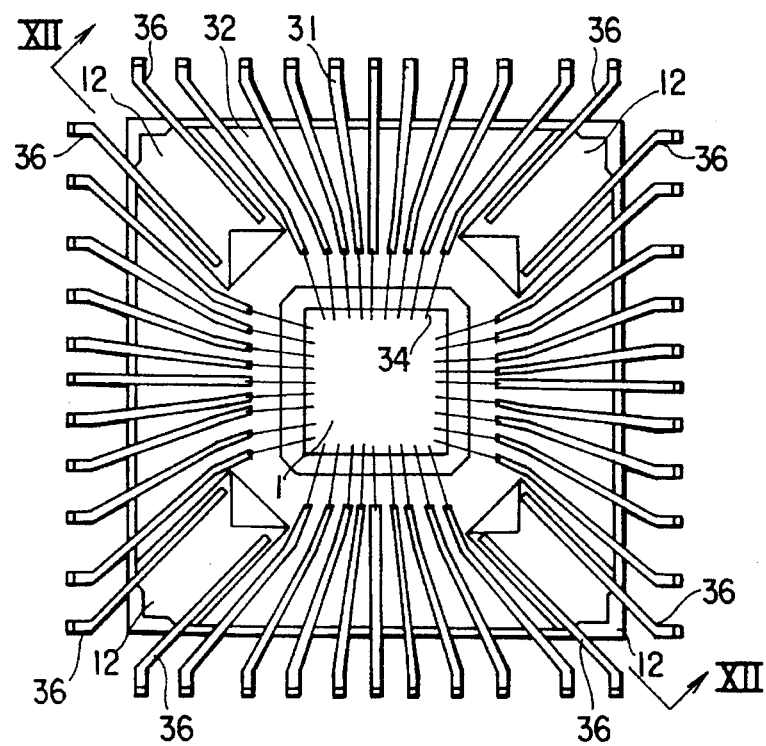
FIG. 11 is a manufacturing process view showing other embodiment of a method for manufacturing the semiconductor device of the present invention.
Figure 12:
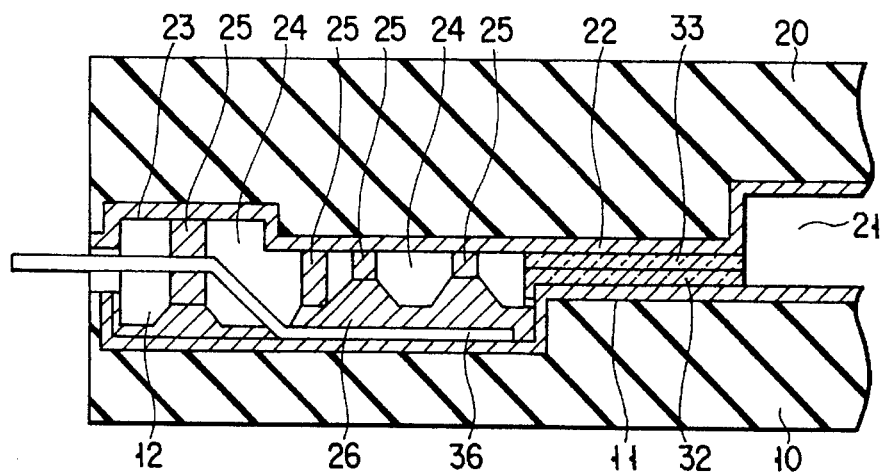
FIG. 12 is a partial cross sectional view showing a state that the concave portion of the substrate mount section and the cap are adhered in the embodiment of FIG. 11.

The following will explain a second embodiment with reference to FIGS. 11 and 12.

FIG. 11 is a plan view of the packaged semiconductor device, and the cap (ceramic cap) 20 and the display of the second seal material 33 are omitted since it is sufficient if the interior of the device is explained.

FIG. 12 is a partial cross sectional view showing a state that the column projection portion and the concave portion 12 of the substrate mount section are inserted in the cross section perspective section taken along a line XII—XII shown in FIG. 11.

The square substrate mount section 10 is formed of a ceramic substrate such as aluminum nitride. At least one concave portion 12 is formed on the main surface where the semiconductor substrate of the substrate mount 10 section 10 is mounted. In this figure, the concave portion 12 is formed every corner, and the long and thin concave portion 12 is extended to the central semiconductor substrate 1.

The first conductive metallic layer 11 such as W/Ni/Au film is deposited on the main surface of the substrate mount section 10 by a vacuum evaporation. The first conductive metallic layer 11 is also formed on the inner surface of the concave portion 12 of the main surface of the base mount section 10.

The semiconductor substrate 1 having the integrated circuit formed is adhered onto the first conductive metallic layer 11 of the central portion of the main surface of the substrate mount section 10 with conductive adhesive such as epoxy resin. On the other hand, the plurality of leads 31 are provided on the peripheral portion of the substrate mount section 10 every side to be fixed by the first seal material 32 such as glass.

The end of each of the leads 31 is directed to the center of the semiconductor substrate 1. Then, the end of each of the leads 31 and the connection electrode (not shown) of the surface of the semiconductor substrate 1 are connected to each other by the boding wire 34 such as an Al line. Moreover, the end portion of each of leads 36, which are provided along both sides of the substrate mount section concave 12, is bent, and the end is electrically connected to the first conductive metallic layer 11 of the interior of the concave portion 12 with the conductive adhering material 26.

The first conductive metallic layer 11 is grounded, and used as a grounded power source line. The second seal material 33 such as glass is provided on the arranged lead group, and the cap 20 is further provided thereon so as to be thermally pressure sealed. At the same time with the above sealing, the column projection section 24, which is attached to the cap 20, is inserted to the concave portion 12, so that first and second conductive metallic layers 11 and 12 are electrically connected to each other. On the main surface of the cap 20 opposite to the substrate mount section 10, there are formed the first concave portion 23 on the peripheral portion, and the second concave portion 21 at a central portion of the main surface.

Then, the second conductive metallic layer 22 is deposited on the main surface of the cap 20 by a vacuum evaporation or spattering. When the cap 20 is adhered to the substrate mount section 10, the semiconductor substrate 1, the top end portion of the lead 31, and the bonding wire 34 are contained in the concave portion 21.

The column projection section 24 of the main surface of the cap 20 is fixed to the first concave portion 23. However, the first concave portion 23 may not be formed. Or, the first concave portion 23 can be formed on the flat surface.

The column projection section 24 is formed of the ceramic substrate such as aluminum nitride, which is the same as the cap material. This embodiment features that the lead 36 is fixed to the concave portion 12 of the substrate mount section 10 and that the plurality of the conductive lines 25 are formed in the column projection section 24.

Since the plurality of conductive paths 25 are provided, the electrical connection between the first and second conductive metallic layers 11 and 22 can be surely made.

Figure 13:
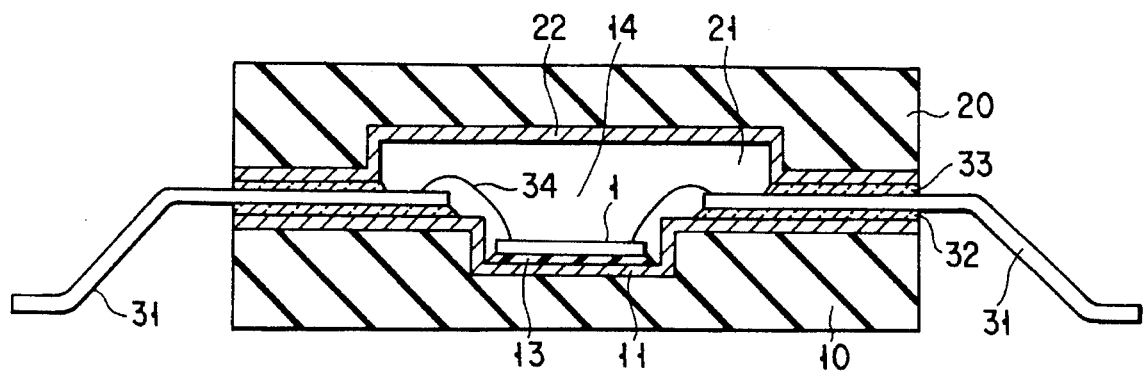
FIG. 13 is a cross sectional view showing a manufacturing process showing further other embodiment of a method for manufacturing the semiconductor device of the present invention.

The following will explain a third embodiment of the present invention with reference to FIG. 13.

In the embodiment shown by the cross sectional view of the semiconductor device of FIG. 13, a method for electrically connecting the first and second conductive metallic layers 11 and 22 is the same as the first embodiment shown in FIGS. 4 and 5. The substrate mount section 10 is formed of the square ceramic substrate such as aluminum nitride. At least one concave portion is formed on the main surface where the semiconductor substrate of the substrate mount section 10 is mounted.

In this embodiment, the concave portion is formed every corner. The concave portion is extended thin and long to the central semiconductor substrate 1 on the main surface of the substrate mount section 10, the first conductive metallic layer 11 is deposited by the vacuum evaporation. As the first conductive metallic layer 11, the W/Ni/Au film is used.

The first conductive metallic layer 11 is also formed in the concave portion of the main surface of the substrate mount section 10. The semiconductor substrate 1 having the integrated circuit formed is adhered onto the first conductive metallic layer 11 of the central portion of the main surface of the substrate mount section 10 with conductive adhesive 13 such as solder. On the other hand, the leads 31 are provided on the peripheral portion of the main surface of the substrate mount section 10 every side to be fixed by the first seal material 32 such as glass.

The end of each of the leads 31 is directed to the center of the semiconductor substrate 1. Then, the end of each of the leads 31 and the connection electrode (not shown) of the surface of the semiconductor substrate 1 are connected to each other by the boding wire 34 such as an Al line.

The first conductive metallic layer 11 is grounded and used as a grounded power source line. The second seal material 33 such as glass is provided on the arranged lead group, and the cap 20 is further provided thereon so as to be thermally pressure sealed.

At the same time with the above sealing, the column projection section 24, which is attached to the cap 20, is inserted to the concave portion, so that first and second conductive metallic layers 11 and 12 are electrically connected to each other.

On the same main surface of the cap 20, the first concave portion (not shown) is formed on the peripheral portion, and the second concave portion 21 is formed on the central portion. Moreover, the second conductive metallic layer 22 is deposited on the main surface by the vacuum evaporation. When the cap 20 is adhered to the substrate mount section 10, the semiconductor substrate 1, the end portion of the lead 31, and the bonding wire 34 are contained in the second concave portion 21.

The feature of this embodiment lies in the point that a cavity 14 is formed at the central portion of the substrate mount section 10 and the semiconductor substrate 1 having the integrated circuit is formed in the cavity 14. The semiconductor substrate 1 is adhered to the cavity 14 with the conductive adhering material 13 such as solder. By containing the semiconductor substrate 1 in the cavity, the thickness of the semiconductor device can be much thinner.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate having an integrated circuit having a connection electrode on its surface;

a substrate mount section, having at least one concave portion on its main surface, for supporting said semiconductor substrate to be fixed thereto;

a first conductive metallic layer formed on the main surface of said substrate mount section including a surface of said concave portion;

a plurality of leads supported and fixed to a peripheral portion of the main surface of said substrate mount section such that their end portions are opposite to said semiconductor substrate;

a bonding wire for connecting said end portion of each lead and said connection electrode of the main surface of the semiconductor substrate;

a cap having at least a first concave portion formed at a position opposite to the concave portion of said substrate mount section on the main surface, and a second concave portion formed at a central portion of said main surface to at least coat said semiconductor substrate, said bonding wire and said end portion of said lead;

a second conductive metallic layer formed on the entire surface of said cap including each surface of said first and second concave portions; and a column projection section having one end portion fixed to the first concave portion of said cap so as to be served as a conductive line electrically connected to said second conductive metallic layer therein at its one end, said column projection section inserted to the concave portion of said opposite substrate mount section, and said conductive line electrically connected to said first conductive metallic layer at its other end.

2. The semiconductor device according to claim 1, wherein the substrate mount section for supporting and fixing said semiconductor substrate has a cavity at a substantially central portion, and said semiconductor substrate is contained in the cavity.

3. The semiconductor device according to claim 1, wherein said substrate mount section has a polygon, and the concave portion of said substrate mount section is formed in an area where said leads from the corner of said substrate mount section to the semiconductor substrate of the central portion are not provided.

4. The semiconductor device according to claim 1, wherein said column projection section has a plurality of conductive lines in its inner portion, and said first and second conductive metallic portions are electrically connected to each other by said plurality of conductive lines.

5. The semiconductor device according to claim 1, wherein when the said substrate mount section is a polygon, said leads are arranged at the corner portions of said substrate mount section, and the leads of the corner portions are connected to an area formed in the concave portion of said substrate mount section of said second conductive metallic layer as a power source line, and the second conductive metallic layer is grounded to obtain transfer impedance matching.

* * * * *